(12) United States Patent
Huang et al.

(10) Patent No.: US 11,663,074 B1
(45) Date of Patent: May 30, 2023

(54) DETERMINING READ VOLTAGES FOR MEMORY SYSTEMS

(71) Applicant: Macronix International Co., Ltd., Hsinchu (TW)

(72) Inventors: Yu-Ming Huang, Taipei (TW); Yung-Chun Li, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 17/528,346

(22) Filed: Nov. 17, 2021

(51) Int. Cl.
*G06F 3/06* (2006.01)
*G06F 11/10* (2006.01)

(52) U.S. Cl.
CPC ........ *G06F 11/1016* (2013.01); *G06F 3/0625* (2013.01); *G06F 3/0655* (2013.01); *G06F 3/0679* (2013.01); *G06F 2201/805* (2013.01)

(58) Field of Classification Search
CPC .. G06F 11/1016; G06F 3/0625; G06F 3/0655; G06F 3/0679; G06F 2201/805
USPC ........................................................ 714/723
See application file for complete search history.

(56) References Cited

U.S. PATENT DOCUMENTS

| | | | | |
|---|---|---|---|---|
| 7,305,596 B2 * | 12/2007 | Noda | ................... | G06F 11/1068 714/48 |
| 7,568,135 B2 * | 7/2009 | Cornwell | ........... | G11C 16/0483 365/201 |
| 8,429,501 B2 * | 4/2013 | Tseng | .................... | G06F 11/008 714/773 |
| 8,631,288 B2 * | 1/2014 | Helm | ...................... | G06F 11/10 714/721 |
| 10,134,474 B1 * | 11/2018 | Chen | ...................... | G06F 3/0679 |
| 2015/0348649 A1 * | 12/2015 | Yang | ........................ | G11C 29/52 714/723 |
| 2017/0148510 A1 | 5/2017 | Bazarsky et al. | | |
| 2020/0027503 A1 | 1/2020 | Chen et al. | | |
| 2022/0028460 A1 * | 1/2022 | Kurose | ............... | G11C 11/5628 |
| 2022/0270687 A1 * | 8/2022 | Tokutomi | ........... | G11C 16/3459 |

FOREIGN PATENT DOCUMENTS

| | | | | |
|---|---|---|---|---|
| CN | 111258931 A | * | 6/2020 | ......... G06F 13/1668 |
| CN | 111883198 A | * | 11/2020 | .......... G06F 11/1068 |
| KR | 20160050400 A | * | 11/2016 | |

OTHER PUBLICATIONS

A 512-GB 3-b/Cell 64-Stacked WL 3-D-NAND Flash Memory, IEEE journal of solid-state circuits, 2018 (Samsung).
A 512Gb 3b/Cell Flash Memory on a 96-Word-Line-Layer Technology, ISSCC 2018 (Toshiba).

* cited by examiner

*Primary Examiner* — Albert Decady
*Assistant Examiner* — Enam Ahmed
(74) *Attorney, Agent, or Firm* — Fish & Richardson P.C.

(57) ABSTRACT

Systems, methods, and apparatus including computer-readable mediums for determining read voltages for memory systems are provided. In one aspect, a memory system includes a memory storing data and a memory controller coupled to the memory. The memory controller is configured to: obtain a first reading output of target memory data in the memory using a first read voltage, and in response to determining that the first reading output fails to pass an Error-Correcting Code (ECC) test, provide the first read voltage to the memory. The memory is configured to: determine a second read voltage based on the first read voltage and generate a second reading output of the target memory data using the second read voltage.

20 Claims, 8 Drawing Sheets

| WL Index | Page Index | P/E Cycle | Retention | Valley Tracking Ranges corresponding to RD[0:6] | | | | | | |
|---|---|---|---|---|---|---|---|---|---|---|
| 2 | 0 | 3K | 2 years | 8 | 8 | 8 | 8 | 8 | 8 | 8 |
| 2 | 1 | 3K | 2 years | 8 | 8 | 8 | 8 | 8 | 8 | 8 |
| 2 | 2 | 3K | 2 years | 8 | 8 | 8 | 8 | 8 | 8 | 8 |
| 2 | 3 | 3K | 2 years | 8 | 8 | 8 | 8 | 8 | 8 | 8 |
| 3 | 0 | 3K | 2 years | 8 | 8 | 8 | 8 | 8 | 8 | 8 |

FIG. 5A

| WL Index | Page Index | P/E Cycle | Retention | Valley Tracking Ranges corresponding to RD[0:6] | | | | | | |
|---|---|---|---|---|---|---|---|---|---|---|
| 2 | 0 | 3K | 2 years | 10 | 6 | 4 | 2 | 4 | 4 | 4 |
| 2 | 1 | 3K | 2 years | 12 | 4 | 8 | 6 | 4 | 6 | 4 |
| 2 | 2 | 3K | 2 years | 14 | 4 | 4 | 8 | 4 | 6 | 6 |
| 2 | 3 | 3K | 2 years | 10 | 4 | 8 | 4 | 2 | 8 | 6 |
| 3 | 0 | 3K | 2 years | 8 | 4 | 6 | 2 | 2 | 2 | 2 |

FIG. 5B

DETERMINING READ VOLTAGES FOR MEMORY SYSTEMS

BACKGROUND

Once memory cells in a data storage device, e.g., a memory system, are programmed, data can be read from the memory cells by sensing a programmed state of each memory cell by comparing a cell threshold voltage to one or more read voltages. However, the cell threshold voltage may change due to one or more factors, such as read disturbance or data retention, which may make the sensed programming states different from the written programmed states and cause failed bits in a reading output of the data.

SUMMARY

The present disclosure describes systems and techniques for determining read voltages for memory systems, e.g., non-volatile memory (NVM) systems.

One aspect of the present disclosure features a memory system including a memory and a memory controller coupled to the memory. The memory controller is configured to: obtain a first reading output of target memory data stored in the memory using a first read voltage, and in response to determining that the first reading output fails to pass a first Error-Correcting Code (ECC) test, provide the first read voltage to the memory. The memory is configured to: determine a second read voltage based on the first read voltage, and generate a second reading output associated with the target memory data using the second read voltage.

In some embodiments, the memory is configured to provide the second reading output to the memory controller, and the memory controller is configured to determine whether the second reading output passes a second ECC test. In some embodiments, the memory includes an ECC circuit configured to determine whether the second reading output passes a second ECC test.

In some embodiments, the memory controller is configured to: determine that the second reading output passes a second ECC test; and output the second reading output as a target reading output for the target memory data.

In some embodiments, the first read voltage is determined based on stored read voltage data using a first set of parameters associated with the target memory data. The second read voltage can be determined based on a second set of parameters associated with the first set of parameters. The second set of parameters can include the first read voltage and an associated valley-tracking range. The stored read voltage data and the first set of parameters can be stored in a lookup table.

In some embodiments, the memory controller is configured to: determine that the second reading output fails to pass the second ECC test; determine a third read voltage based on a second set of parameters, the second set of parameters including at least one of a result of the second ECC test or the first set of parameters; obtain a third reading output associated with the target memory data in the memory using the third read voltage; and determine whether the third reading output passes a third ECC test.

In some embodiments, the memory controller is configured to: in response to determining that the third reading output fails to pass the third ECC test, determine whether a predetermined read threshold has been reached; in response to determining that the predetermined read threshold has been reached, determine a failure of reading the target memory data from the memory; and in response to determining that the predetermined read threshold has not been reached, determine a new read voltage based on a result of the third ECC test.

In some embodiments, the memory controller is configured to: in response to determining that the third reading output passes the third ECC test, output the third reading output as a target reading output for the target memory data. In some embodiments, the memory controller is configured to determine the first read voltage using stored read voltage data based on the first set of parameters, and the memory controller is configured to: in response to determining that the third reading output passes the third ECC test, update the stored read voltage data using at least one of the third read voltage or the second set of parameters.

In some embodiments, the memory controller is configured to determine the third read voltage by using at least one machine learning (ML) algorithm based on the second set of parameters. The at least one ML algorithm can include at least one of a linear regression, a support vector regression, or a deep learning algorithm including a convolutional neural network (CNN) algorithm or a Recurrent Neural Network (RNN) algorithm.

In some embodiments, the memory controller is configured to: decode the first reading output using a hard decision decoding scheme; and decode the third reading output using at least one of the hard decision decoding scheme or a soft decision decoding scheme. The memory controller can be configured to: decode the second reading output using the hard decision decoding scheme. In some embodiments, the memory controller is configured to decode any one of the first reading output, the second reading output, and the third reading output by first using the hard decision decoding scheme and then using the soft decision decoding scheme if the hard decision decoding scheme fails.

In some embodiments, the first set of parameters includes at least one of address information, a number of P/E cycles, a reading temperature, a read disturbance level, or a retention time. In some embodiments, the second set of parameters includes at least one of a failed bit count in the second reading output, a number of "1" values obtained for each read voltage, a number change of "1" values between a previous read voltage and a current read voltage, a read time, a syndrome of low-density parity-check (LDPC) code, or a number of iteration of LDPC code.

In some embodiments, the stored read voltage data is generated based on supervised ML training using a plurality of inputs associated with the memory and corresponding optimal read voltages, each of the optimal read voltages corresponding to a minimum failed bit count of a reading output for a respective page in the memory with a respective input of the inputs, each of the inputs including respective values of a plurality of parameters, the plurality of parameters including the first set of parameters.

In some embodiments, the stored read voltage data includes a transfer function generated based on the supervised ML training, the transfer function representing a relationship between an input of the plurality of parameters and an optimal read voltage.

In some embodiments, the memory controller is configured to determine a valley-tracking range based on the first read voltage and the corresponding optimal read voltages for the plurality of inputs, and the memory is configured to determine the second read voltage using a valley-tracking read scheme based on the valley-tracking range and the first read voltage. In some embodiments, the valley-tracking range is no greater than a predetermined upper threshold and no smaller than predetermined lower threshold.

In some embodiments, the memory is configured to: obtain a series of values associated with reading outputs of the target memory data using a series of sequential read voltages in a range defined by the first read voltage and the valley-tracking range; and determine a read voltage corresponding to a minimum of the series of values to be the second read voltage.

In some embodiments, the series of values include at least one of: a series of cell counts corresponding to the target memory data, a series of accumulated voltages or currents of read-out bits corresponding to the target memory data, or a series of differential voltages or currents of the accumulated voltages or currents.

In some embodiments, the memory controller is configured to update the stored read voltage data with the second read voltage in response to determining that the second reading output passes the second ECC test.

In some embodiments, the memory controller is configured to: determine that the first reading output fails to pass the first ECC test by determining that at least one part of the first reading output fails to pass the first ECC test, the at least one part of the first reading output corresponding to at least one failed part of the target memory data, and the memory is configured to read the at least one failed part of the target memory data using the second read voltage to generate the second reading output.

In some embodiments, the memory controller is configured to provide information of the at least one failed part of the target memory data to the memory.

In some embodiments, the memory controller is configured to: determine that a remainder of the first reading output passes the first ECC test, where the remainder of the first reading output corresponds to a remainder of the target memory data and passes the first ECC test; and determine that the remainder of the first reading output is a target reading output of the remainder of the target memory data, where the memory is configured not to read the remainder of the target memory data using the second read voltage.

In some embodiments, the target memory data includes a page having multiple chunks, and the memory controller is configured to determine that a corresponding first reading out of at least one chunk of the page using the first read voltage fails to pass the first ECC test, and where the memory is configured to read the at least one chunk using the second read voltage.

In some embodiments, the memory controller is configured to: obtain a first particular reading output of particular memory data to be read from the memory using a first particular read voltage that is determined based on a first particular set of parameters associated with the particular memory data; determine that the first particular reading output fails to pass a corresponding ECC test; in response to determining that the memory is busy, determine a second particular read voltage based on a second particular set of parameters including at least one of a result of the corresponding ECC test associated with the first particular reading output or the first particular set of parameters; obtain a second particular reading output by reading the particular memory data using the second particular read voltage; determine whether the second particular reading output passes the corresponding ECC test; and in response to determining that the second particular reading output passes the corresponding ECC test, output the second particular reading output as a target reading output of the particular memory data in the memory.

Another aspect of the present disclosure features a memory system including: a memory including a memory-side read circuit and a memory controller including a controller-side read circuit. The memory controller is configured to: determine, by the controller-side read circuit, a first read voltage using stored read voltage data based on a first set of parameters associated with target memory data to be read from the memory; obtain a first reading output of the target memory data using the first read voltage; and, in response to determining that at least one part of the first reading output fails to pass a first Error-Correcting Code (ECC) test, provide the first read voltage and information of at least one failed part of the target memory data corresponding to the at least one part of the first reading output to the memory. The memory is configured to: determine, by the memory-side read circuit, a second read voltage based on the first read voltage; and generate a second reading output of the at least one failed part of the target memory data using the second read voltage.

In some embodiments, the memory controller is configured to: determine that the second reading output fails to pass a second ECC test; determine, by the controller-side read circuit, a third read voltage based on a second set of parameters including at least one of a result of the second ECC test or the first set of parameters; obtain a third reading output of the at least one failed part of the target memory data using the third read voltage; determine whether the third reading output passes a third ECC test; in response to determining that the third reading output passes the third ECC test, output the third reading output and a remainder of the first reading output as a target reading output of the target memory data, where the remainder of the first reading output passes the first ECC test; and update the stored read voltage data with at least one of the third read voltage or the second set of parameters.

In some embodiments, the memory-side read circuit is configured to determine the second read voltage using a valley-tracking read scheme based on a valley-tracking range determined by the memory controller, and the controller-side read circuit is configured to determine the third read voltage using at least one machine learning algorithm based on the second set of parameters.

In some embodiments, the controller-side read circuit is configured to determine the first read voltage using at least one machine learning algorithm based on the first set of parameters. In some embodiments, the memory controller is configured to determine the first read voltage using a lookup table.

Another aspect of the present disclosure features a memory system including: a memory storing data and a memory controller coupled to the memory. The memory is configured to: determine a first read voltage based on a first set of parameters associated with memory data using a valley-tracking read scheme, and generate a first reading output of the memory data using the first read voltage. The memory controller is configured to: in response to determining that the first reading output fails to pass a first Error-Correcting Code (ECC) test, determine a second read voltage based on a second set of parameters that includes at least one of a result of the first ECC test and the first set of parameters; obtain a second reading output of the memory data in the memory using the second read voltage; determine whether the second reading output passes a second ECC test; and in response to determining that the second reading output passes the second ECC test, output the second reading output as a target reading output for the memory data.

Another aspect of the present disclosure features a method including: obtaining, by a memory controller, a first reading output of target memory data stored in a memory using a first read voltage; in response to determining that the first reading output fails to pass an Error-Correcting Code (ECC) test, provide, by the memory controller, the first read voltage to the memory; determining, by the memory, a second read voltage based on the first read voltage; and generating, by the memory, a second reading output associated with the target memory data using the second read voltage.

Implementations of the above techniques include methods, systems, computer program products and computer-readable media. In one example, a method can be performed by a memory system including a memory and a memory controller coupled to the memory, and the method can include the above-described actions performed by the memory controller and the memory, e.g., the actions for determining read voltages for the memory system. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIGS. 5A-5B illustrate example valley-tracking ranges for TLC memory cells without (FIG. 5A) and with (FIG. 5B) considerations of a memory controller's determination of previous read voltages, according to one or more implementations of the present disclosure.

DETAILED DESCRIPTION

Figure 1A:
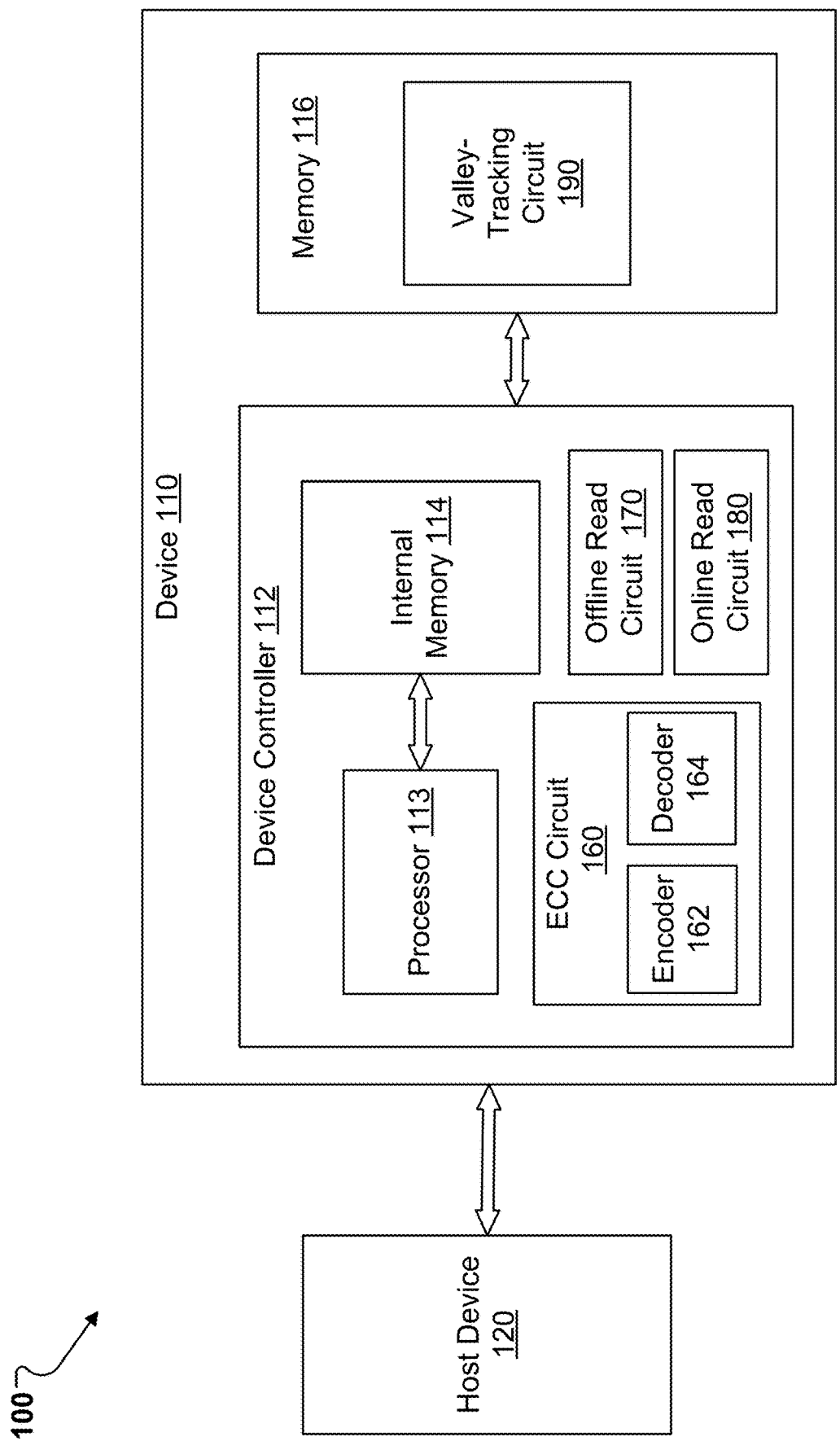
FIG. 1A illustrates an example of a system, according to one or more implementations of the present disclosure.

Due to frequent read operations, data stored in a memory may suffer from read disturbance, in which states of memory cells, e.g., an erased state and one or more programmed states, in the memory may have increased threshold voltages. The read disturbance may cause failed bits (or error bits) in reading outputs of the data. An error-correcting code (ECC) decoder can be configured to decode the data read from the memory to detect and correct, up to an error correction capability of an ECC scheme, any bit errors that may be present in the data.

The data can be read from memory cells by sensing a state of each memory cell by comparing a cell threshold voltage to a read voltage (or a reference read voltage). The read voltage can be optimized to be an optimal read voltage (or an optimized read voltage), such that a failed bit count (or a number of failed bits) in the reading output of the data is minimum (or fewest). The optimal read voltage can depend on a number of parameters, e.g., a program/erase (P/E) cycle count, a word line (WL) address or page address, temperature, retention time, layer by layer variation, block by block variation, and/or chip by chip variation. Determining the optimal read voltage can be time-consuming and tedious, and the computing time and power consumption can increase as the number of input parameters considered in the determining process. Therefore, it would be desirable to develop techniques that can read accurately with a limited read latency over a time-variant channel and can reduce ECC decoding overhead via optimal read voltages.

In some cases, a same verified read voltage is used for reading data from a memory, no matter how input parameters change. However, the verified read voltage can be far from an optimal read voltage, leading to an additional overhead for ECC decoding.

In some cases, a lookup table storing multiple verified read voltages is used. The verified read voltages are in a static order according to corresponding priority levels that are independent to input parameters. Data is first read with a first priority verified voltage; if a reading output of the data fails to pass an ECC test, a second priority verified voltage is then used. The read retry process continues until the reading output passes the ECC test.

In some cases, data is first read with a read voltage determined based on input parameters. If the reading output fails to pass the ECC test, a read retry process is performed with a lookup table storing a static order of read voltages that are independent to the input parameters. However, the lookup table construction can cost a great amount of human resources and developing time. Engineers may have to fine tune optimal read voltages case by case based on the input parameters. The table size can become larger and larger with different process technologies and different operating conditions. It can cause unacceptable read latency, e.g., on three-dimensional (3D) memory devices such as TLC/QLC NAND flash memory devices.

In some cases, machine learning (ML) technology can be used to determine optimal read voltages. In some cases, offline inference by machine learning can determine a relationship between input parameters and optimal read voltages, which can be recorded in a lookup table or be connected by a transfer function. However, the offline inference can cause a huge memory overhead to achieve high accuracy. In some cases, online inference by machine learning can compute an optimal read voltage whenever there is a read request. The online inference can require additional computing and time overheads to degrade the read latency. Moreover, implementations of machine learning in the memory controller can cause additional computational and hardware cost on the memory controller. Further, ML-based read cannot address inter-chip or intra-chip variation and retention issues, and may still need read retry to improve read reliability.

In some cases, a valley-tracking (or valley-searching) scheme can be used to determine an optimal read voltage. In the valley tracking scheme, bits stored in the memory are read out and counted at a succession of different voltages, and a curve showing a change in bit count resulting from each change in read voltage is observed. The voltage with a minimum change in bit count can correspond to a bottom of a valley of the curve and provide the optimal read voltage. The valley tracking scheme can handle the retention issue and inter-chip and/or intra-chip variation. However, an accuracy of the determined read voltage using the valley tracking technique is worse than ML-based read or other on-chip optimized read techniques, e.g., when a distribution shift is severe, such as reading at a high temperature and under severe retention. Thus, read retry may be still needed to further improve read reliability.

Implementations of the present disclosure provide systems, methods, and techniques for determining read voltages, e.g., optimal read voltages, for memory systems, e.g., non-volatile memory (NVM) systems, with multiple phase read combinations. The techniques can optimize read voltages by combining initial offline read voltage determination (Phase I), on-chip valley-tracking read voltage determination (Phase II), and/or online read voltage determination (Phase III). Particularly, the valley-tracking read voltages in Phase II can be determined based on a result of the initial offline read voltage determination, which can narrow a search range (or a valley-tracking range) of the optimal read voltages and improve the read accuracy, reliability, and speed of the determination process.

In some implementations, the initial offline read voltage determination (Phase I) can be performed by a memory controller, e.g., by software or hardware. In some cases, the initial offline read voltage can be determined by a lookup table (e.g., dynamically updated), a function, a hash, or an exhaustive search. In some cases, the initial offline read voltage can be inferred by a machine learning (ML) circuit using at least one ML algorithm, e.g., supervised ML training with an offline inference ML read algorithm.

Although offline optimized read can achieve a good accuracy with a tedious memory overhead, the techniques disclosed herein can use a few parameters with a smaller memory overhead to provide a reasonable initial read that is better than a default read. To compensate a reliability loss due to space limitations of the offline initial read determination, the on-chip valley-tracking based read can be implemented in the memory chip and configured to be triggered once the offline initial read fails. The valley-tracking based read can be based on counting the number of cells, (e.g., by the number itself, voltage, or current) with information of Phase I, and can be configured to find a distribution trend due to retention or chip-by-chip variation. The valley-tracking range (or a search range) and parameters for Phase II can be determined (or optimized) according to a result of Phase I, so that the memory controller-aided valley-tracking read can achieve not only a lower latency but also a better read accuracy than a conventional valley-tracking read without an input from the initial read voltage determination.

To further improve a read accuracy, e.g., reducing error bits before ECC decoding, the online read voltage determination (Phase III) can be triggered if the on-chip valley-tracking read fails. The online read voltage determination can be implemented by a microcontroller unit (MCU) or a hardware design in the memory controller. The online read voltage determination can be performed using at least one ML algorithm based on a result of the ECC test in Phase II and a set of parameters including parameters in Phase I and/or Phase II. The ML algorithms can include linear regression, support vector regression, CNN, RNN, or other suitable algorithms. The online read voltage determination can be not limited to any ML algorithms or computation.

The initial offline read voltage determination can be updated based on a result of Phase II and/or a result of Phase III. For example, the lookup table or stored read voltage data used in Phase I can be updated using the optimal read voltages determined in Phase II and/or Phase III and one or more parameters used in Phase II and/or Phase III. That is, the three phases can be sequentially triggered and dynamically updated.

For most read requests, read voltages determined in Phase I can enable successful reading outputs. Phase II is triggered not for each read request, but only when Phase I fails. Moreover, if only part of the memory data (e.g., one or more chunks of a page to be read) fails to pass an ECC test, Phase II (and Phase III) can be triggered to conduct a read only on the failed part (e.g., the one or more chunks), not the whole memory data (e.g., the whole page).

The techniques can reduce ECC decoding overhead, reduce average online inference time of ML algorithms, reduce computation and extra memory overhead, reduce read latency, reduce developing costs, improve read accuracy, and improve reliability of the memory systems. The techniques can be applied to various types of volatile memory devices or non-volatile memory (NVM) devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to two-dimensional (2D) memory devices or three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

FIG. 1A illustrates an example of a system 100 that includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a storage device or a non-volatile memory (NVM) that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

In some implementations, the device controller 112 is configured to receive data and instructions from and to send data to the host device 120. The device controller 112 is further configured to send data and commands to the memory 116 and to receive data from the memory 116. For example, the device controller 112 is configured to send data and a write command to instruct the memory 116 to store the data to a specified address. As another example, the device controller 112 is configured to receive a read request (or a read command) from the host device 120 and send a corresponding read command to the memory 116 to read data from a specified address in the memory 116.

In some implementations, as shown in FIG. 1A, the device controller 112 includes an ECC circuit 160. The ECC circuit 160 can include an encoder 162 and a decoder 164. The ECC encoder 162 can be configured to receive data to be stored to the memory 116 and to generate a codeword, e.g., by encoding the data using an ECC encoding scheme. The ECC encoder 162 can include a Reed Solomon encoder, a Bose-Chaudhuri-Hocquenghem (BCH) encoder, a low-density parity check (LDPC) encoder, or any combination thereof. The ECC decoder 164 can be configured to decode data read from the memory 116 to detect and correct, up to an error correction capability of the ECC scheme, any bit errors that may be present in the data. The ECC decoder 164 can perform BCH decoding or LDPC decoding.

In some implementations, the ECC circuit 160 is implemented in the memory 116. In some implementations, the memory 116 includes a memory-side ECC circuit, similar to the ECC circuit 160 in the device controller 112. By integrating the memory-side ECC circuit into the memory 116, a data transfer volume through electrical connection boards can be greatly reduced, which can reduce power consumption of the device 110. In some cases, moving at least part of the ECC coding/decoding capability from the device controller 112 to the memory 116 can disperse (or separate) heat sources (or power sources) across the device 110 and increase heat dissipation in the device controller 112.

As discussed with further details below, the device controller 112 can be configured to determine read voltages (e.g., optimal read voltages) for reading data from the memory 116, e.g., in response to read requests from the host device 120. In some embodiments, the device controller 112 stores lookup tables, functions, or hashes, associating optimal read voltages with a first set of parameters (e.g., address information, a number of P/E cycles, a reading temperature, a read disturbance level, or a retention time). The lookup tables, functions, or hashes can be implemented by software components such as program instructions.

In some embodiments, the device controller 112 includes a hardware component, e.g., an offline read circuit 170, configured to determine initial read voltages through an offline read voltage determination (e.g., during Phase I). The offline read circuit 170 can be a machine learning (ML) circuit. For example, a supervised ML offline training and inference can be pre-executed on the memory 116, e.g., during manufacturing the device 110, to determine a relationship between input parameters associated with the memory 116 and optimal read voltages. A result of the supervised ML offline training and inference, e.g., a transfer function, can be stored as ML data that can be stored in the device controller 112, e.g., in the ML circuit 150 or in the internal memory 114. In some implementations, the ML data can be also stored in the memory 116.

In some embodiments, the device controller 112 includes a hardware component, e.g., an online read circuit 180, configured to determine optimized read voltages through an online read voltage determination (e.g., during Phase III) based on a second set of parameters and one or more results of previous read outputs. The second set of parameters for the online read voltage determination can include the first set of parameters for the offline read voltage determination. The online read circuit 180 can be an ML circuit configured to use one or more ML algorithms to determine read voltages based on the second set of input parameters. The ML algorithms can include linear regression, support vector regression, CNN, RNN, or other suitable algorithms. If a reading output of memory data using the determined read voltage fails to pass the ECC test, the online read circuit 180 can adjust the second set of input parameters, e.g., by adding or updating one or more parameters, and generate a new read voltage. If the reading output of the memory data using the new read voltage passes the ECC test, the new reading output is output as the target reading output of the memory data. A result of the online read voltage determination, e.g., the read voltage and associated information such as the second set of parameters, can be used to calibrate or update the stored read voltage data (or lookup table) for the offline read circuit 170. That is, the content of the stored read voltage data can be dynamically updated. In some implementations, the offline read circuit 170 and the online read circuit 180 are implemented by a single circuit such as an ML circuit.

As discussed with further details below, the memory 116 includes an on-chip valley-tracking circuit 190 configured to determine read voltages using a valley-tracking scheme based on information from the offline read circuit 170. For example, the offline read circuit 170 can provide initial read voltages and valley-tracking voltage ranges to the valley-tracking circuit 190. The on-chip valley-tracking circuit 190 can be triggered once the offline initial read using the offline read circuit 170 fails. In the valley-tracking scheme, bits stored in the memory are read out and counted at a succession of different read voltages, and a curve showing a change in bit count resulting from each change in read voltage is observed. The voltage with a minimum change in bit count can correspond to a bottom of a valley of the curve, and can provide the optimal read voltage. The valley-tracking based read can be based on counting the number of cells via voltage or current), and can be configured to find a distribution trend due to retention or chip-by-chip variation.

In some implementations, the on-chip valley-tracking circuit 190 includes analog-to-digital converter (ADC) circuitry. The ADC circuitry can include an accumulating circuit configured to accumulate currents (or voltages) from multiple bits during a read operation to obtain a sum of the currents (or voltages). The accumulating circuit can include an ADC configured to convert an analog signal of the sum of the currents (or voltages) to a digital value. The ADC circuitry enables to gain a faster counting time, e.g., during a valley search to determine a calibrated read voltage (or an optimal read voltage). For example, starting from a predetermined read voltage (e.g., from the offline read circuit 170), a succession of different read voltages in a valley-tracking range (e.g., determined by the offline read circuit 170) can be tested as part of a valley search. For each tested voltage, the ADC circuitry can accumulate currents from multiple memory cells on a page corresponding to a word line, obtain a sum of the currents, and covert the sum into a digital value. The on-chip valley-tracking circuit 190 can compare the digital values from the success of different read voltages, and determine a calibrated read voltage based on the multiple digital values and the different read voltages. In some cases, the read voltage that provides the smallest change in bit count can correspond to the bottom of the valley, and can provide the optimal or calibrated read voltage. To improve accuracy, the on-chip valley-tracking circuit 190 can also compare first differences between digital values for adjacent read voltages or even second differences between adjacent first differences to determine the bottom of the valley.

If a reading output of memory data using the on-chip valley-tracking circuit 190 passes the ECC test, the reading output of the memory data can be output as a target reading output of the memory data. If the reading output of the memory data fails to pass the ECC test, the online read circuit 180 can be triggered, e.g., by the device controller 112, to determine a new read voltage based on a result of the ECC test and the second set of parameters.

The memory 116 includes a plurality of blocks. The memory 116 can be a two-dimensional (2D) memory including 2D memory blocks. The memory 116 can also be a three-dimensional (3D) memory including 3D memory blocks. Each block can include a same number of pages. Each page has a unique number in the block. Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together. In some implementations, the memory 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. 1A, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

Figure 1B:
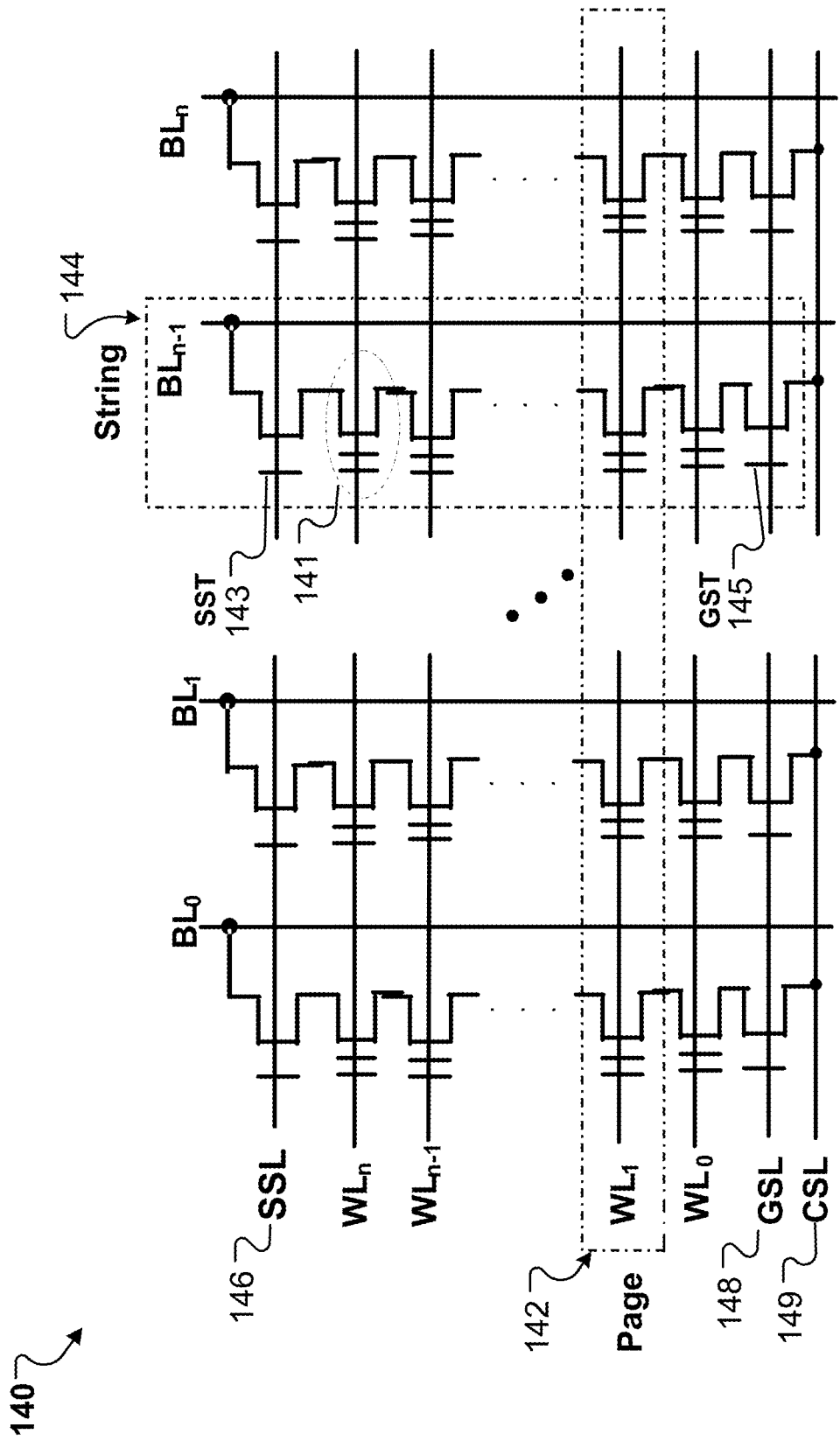
FIG. 1B is a schematic diagram of an example block of a two-dimensional (2D) memory, according to one or more implementations of the present disclosure.

FIG. 1B illustrates an example configuration of a 2D memory block 140 when the memory 116 is a 2D memory. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0$, $WL_1$, ..., $WL_{n-1}$, $WL_n$. The cell strings 144 or the memory cells 141 are connected to a common source line (CSL) 149 via the GST 145. The CSL 149 can be coupled to a ground. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

Figure 1C:
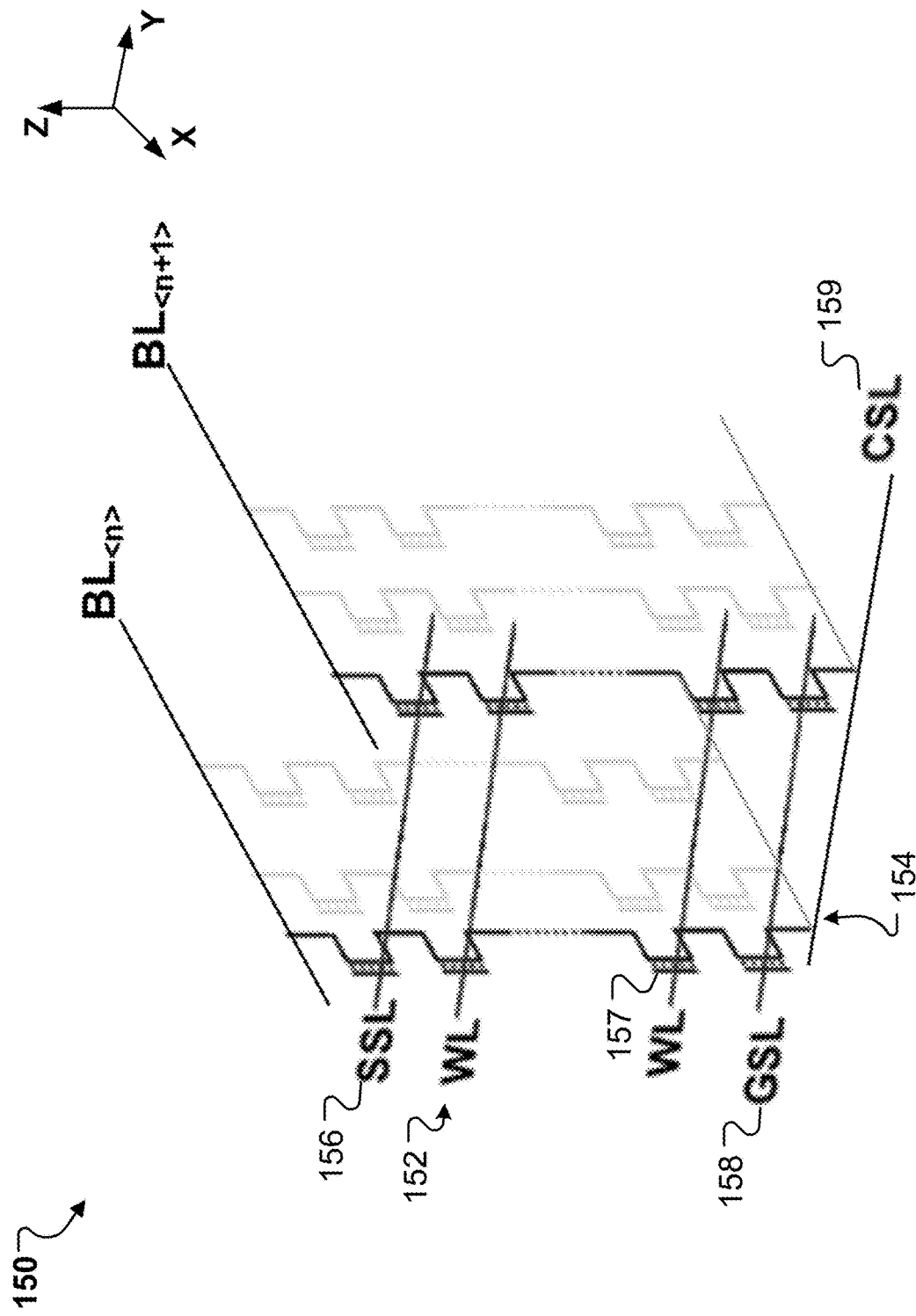
FIG. 1C is a schematic diagram of an example block of a three-dimensional (3D) memory, according to one or more implementations of the present disclosure.

FIG. 1C illustrates an example 3D memory block 150 when the memory 116 (shown in FIG. 1A) is a 3D memory. The 3D memory block 150 can be a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The SSL 156 can be a conductive line or layer formed on top of cell pages (or word line layers) 152. The memory block 150 can include multiple SSLs 156 on top of the cell pages 152. The CSL 159 can be a conductive layer (or multiple conductive lines) formed on a substrate of the 3D memory. The CSL 159 can be coupled to the ground.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state can use the lowest voltage rage.

Figure 2A:
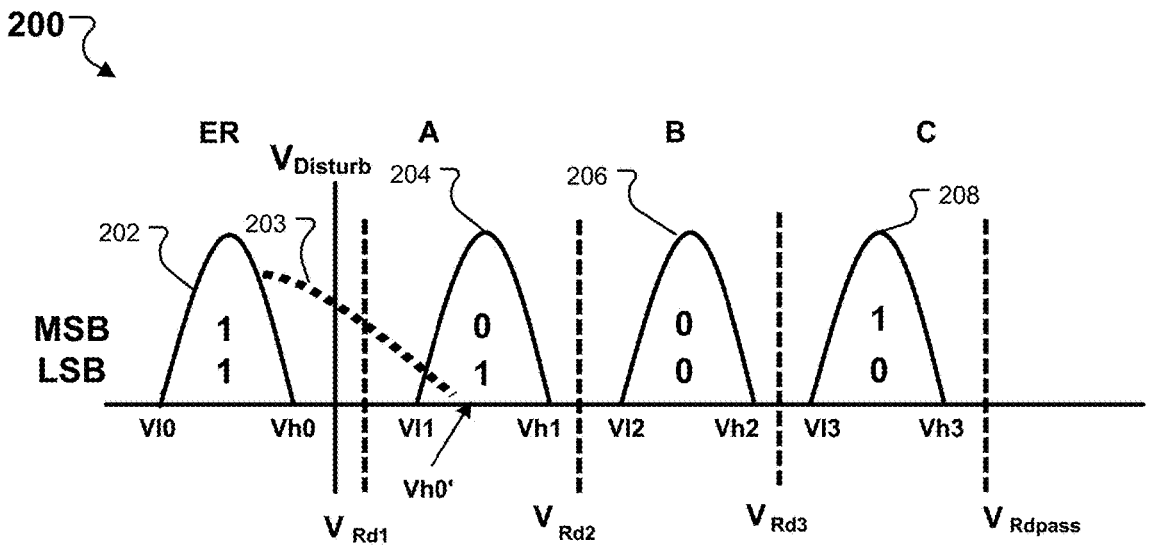
FIG. 2A illustrates an example of threshold voltage distributions of multi-level cell (MLC) memory cells for different states, according to one or more implementations of the present disclosure.

FIG. 2A illustrates an example 200 of threshold voltage distributions and read voltages for different states of a memory cell of a memory, according to one or more implementations. The memory cell can be the memory cell 141 of FIG. 1B or 157 of FIG. 1C. The memory can be the memory 116 of FIG. 1A, e.g., a NAND flash memory. For illustration purposes only, the memory cell is an MLC capable of storing two-bit data.

The memory cell can be programmed or erased to have any one of four states ER, A, B, and C. In some examples, ER is an erased state (1, 1), and A, B, C are programmed states (0, 1), (0, 0), and (1, 0). The states ER, A, B and C have progressively higher read voltages. The MLC NAND flash memory can partition the two bits of each memory cell in a word line across two pages, which are the unit of data programmed at a time. The least significant bits (LSBs) of all memory cells in one word line form the LSB page of the word line, and the most significant bits (MSBs) of these cells on the word line form the MSB page of the word line.

Once programmed or erased, the memory cell has a corresponding threshold voltage. The threshold voltage is a characteristic of the memory cell. The memory cell can be a floating gate transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages in a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between Vl0 and Vh0, the memory cell is in the state ER; if the memory cell has a threshold voltage between Vl1 and Vh1, the memory cell is in the state A; if the memory cell has a threshold voltage between Vl2 and Vh2, the memory cell is in the state B; and if the memory cell has a threshold voltage between Vl3 and Vh3, the memory cell is in the state C. Curves 202, 204, 206, 208 show threshold voltage distributions of the respective states ER, A, B, C of the memory cell, respectively.

During a read operation, a read voltage can be applied to a word line coupled to a gate of a selected memory cell to determine whether the selected memory cell is a turned-on or turned-off state. When a read voltage $V_{Rd1}$ that is larger than the threshold voltage of ER but smaller than the threshold voltage of A is applied, the memory cell is turned on when it has the state ER and turned off when it has the state A, B, or C; when a read voltage $V_{Rd2}$ that is larger than the threshold voltage of A but smaller than the threshold voltage of B is applied, the memory cell is turned on when it has the state ER or A and turned off when it has the state B or C; when a read voltage $V_{Rd3}$ that is larger than the threshold voltage of B but smaller than the threshold voltage of C is applied, the memory cell is turned on if it has the state ER, A, or B and off when it has the state C. When the read voltage $V_{Rdpass}$ that is larger than all the threshold voltages of the states ER, A, B, C is applied, the memory cell is turned on regardless of whatever state the memory cell had.

During the read operations, other memory cells in the same bit line as the selected memory cell are applied with a pass voltage $V_{Rdpass}$ and are turned on. Thus, if the selected memory cell is turned on under a read voltage $V_{Rd}$, the memory cells in the corresponding bit line form a conductive path, and there will be a current or a voltage change, which can be detected by a current or voltage sensor coupled to the bit line. If the selected memory cell is turned off under the read voltage, the memory cells in the corresponding bit line does not form a conductive path, and there is no current or no voltage change, which can be detected by a current or voltage sensor coupled to the bit line.

Due to repeated read operations, a read disturbance phenomenon may occur. In the read disturb phenomenon, a threshold voltage of the memory cell abnormally increases. As illustrated in FIG. 2A, in some cases, the distribution curve 202 for the erased state ER includes a dotted curve 203, which includes a higher threshold voltage. For example, the new higher limit voltage Vh0' is larger than the higher limit voltage Vh0. When the new higher limit voltage Vh0' is in the threshold voltage range Vl1 and Vh1 of the programmed state A, the erased state ER overlaps with the programmed state A. That is, the memory cell has overlapping states. When a read voltage $V_{Disturb}$ is applied, the memory cell having a threshold voltage in the erased state ER becomes a turned-off state instead of a turned-on state. Thus, by detecting whether the memory cell is on or off under a specific read condition, it can be determined that whether or not the memory cell suffers from read disturbance. In some cases, memory cells being in states having lower threshold voltages, e.g., ER and A, are more susceptible to read disturbance than states having higher threshold voltages, e.g., B and C.

Figure 2B:
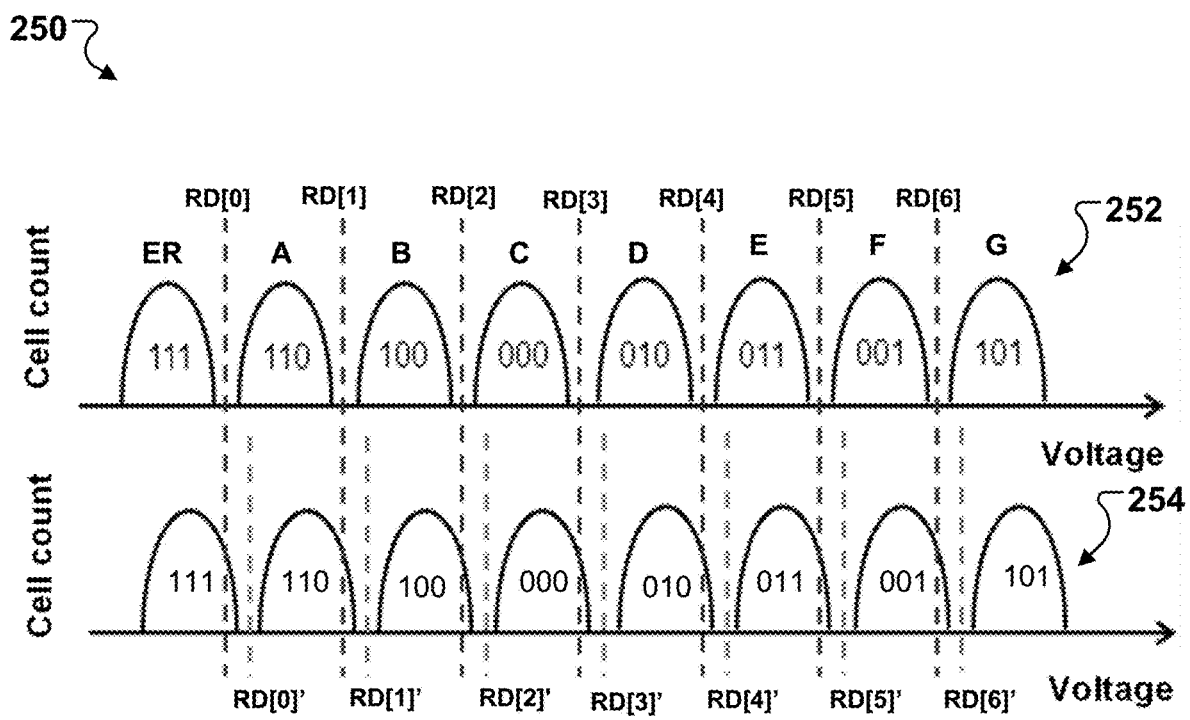
FIG. 2B illustrates an example of read voltage changes for triple-level cell (TLC) memory cells for different states, according to one or more implementations of the present disclosure.

FIG. 2B illustrates an example 250 of read voltage changes for TLC memory cells for different states, according to one or more implementations of the present disclosure. The memory cell can be the memory cell 141 of FIG. 1B or 157 of FIG. 1C. As noted above, the TLC is capable of storing three-bit data. The memory cell can be programmed or erased to have any one of eight states including an erased state (ER) and seven programmed states (A, B, C, D, E, F, and G). In some examples, ER is an erased state (1, 1, 1), and A, B, C, D, E, F, G are programmed states (1, 1, 0), (1, 0, 0), (0, 0, 0), (0, 1, 0), (0, 1, 1), (0, 0, 1), and (1, 0, 1). The eight states have progressively higher read voltages. The TLC NAND flash memory can partition the three bits of each memory cell in a word line across three pages, which are the unit of data programmed at a time. Each page can include multiple chunks, e.g., 4 chunks. Each page can be read at a time. In some cases, a part of the page (e.g., one or more chunks) can be also individually read out.

As diagram 252 in FIG. 2B shows, TLC memory cells can be correctly read out using seven default read voltages RD[0], RD[1], RD[2], RD[3], RD[4], RD[5], RD[6]. There is no overlap between adjacent states, and each read voltage is between distributions of threshold voltages of the adjacent states. Due to repeated read operations, a read disturbance phenomenon may occur to the TLC memory cells, and threshold voltages of the TLC memory cells abnormally increase, as diagram 254 in FIG. 2B shows. If the TLC memory cells are still read using the seven default read voltages RD[0], RD[1], RD[2], RD[3], RD[4], RD[5], RD[6], bits stored in the TLC memory cells may be wrongly read out. Thus, each of the default read voltages can be adjusted or updated to a new read voltage (or an optimal read voltage) RD[0]', RD[1]', RD[2]', RD[3]', RD[4]', RD[5]', RD[6]', which can be used to correctly read out the bits stored in the TLC memory cells.

An optimal read voltage can be associated with a number of parameters, including address information, a number of program/erase (P/E) cycles, a reading temperature, a read disturbance level, or a retention time.

Figure 3:
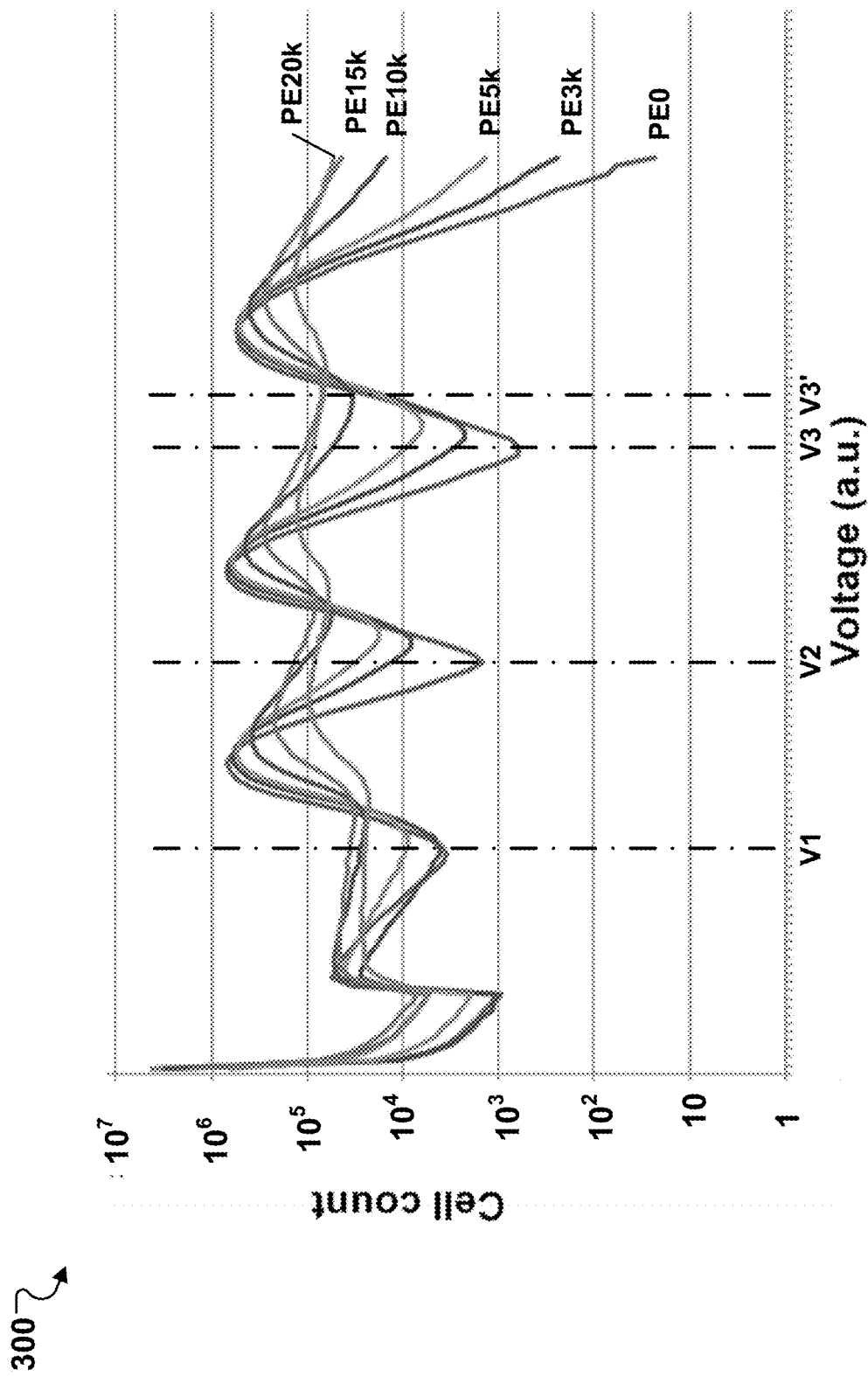
FIG. 3 illustrates an example of relationships between memory cell counts of a reading output and read voltages with different program/erase (P/E) cycle counts, according to one or more implementations of the present disclosure.

FIG. 3 illustrates an example 300 of profiles representing relationships between MLC cell counts and read voltages with different P/E cycles on a memory (0, 3,000 or 3 k, 5,000 or 5 k, 10,000 or 10 k, 15,000 or 15 k, 20,000 or 20 k). FIG. 3 shows that threshold voltage distributions of memory cells and thus an optimal reading voltage can vary depending on one or more input parameters, e.g., P/E cycles, of the memory cells. A PE0 profile, when there is no P/E cycle, can correspond to a profile of threshold voltage distributions shown in FIG. 2A. A read voltage V1 corresponds to the read voltage $V_{Rd1}$ in FIG. 2A and can be an optimal read voltage to read the erased state ER (1, 1) of memory cells. A read voltage V2 corresponds to the read voltage $V_{Rd2}$ in FIG. 2A and can be an optimal read voltage to read the ER (1, 1) and the programmed state A (0, 1) of memory cells. A read voltage V3 corresponds to the read voltage $V_{Rd3}$ in FIG. 2A and can be an optimal read voltage to read the erased state ER (1, 1), the programmed state A (0, 1), and the programmed state B (0, 0) of memory cells, and the remaining memory cells can be determined to have the programmed state C (1, 0). With the increase of the number of P/E cycles on the memory, the optimal read voltages are increased and the profiles become shallower.

As an example, if the read voltage V3 is used as an initial read voltage to read MLC memory cells with 10 k P/E cycles in a valley-tracking read scheme, a valley-tracking range can be too large and the read can be time consuming, because the profile of threshold voltage distributions significantly changes and the optimal read voltage shifts to V3'. In contrast, offline read voltage determination (e.g., using supervised ML training) can cause a huge memory overhead to achieve a high accuracy.

Implementations of the present disclosure provide a controller-aided valley-tracking read scheme using a result of offline read voltage determination, as discussed with further details below, which can narrow a search range of the optimal read voltages and improve the read accuracy, reliability, and speed of the determination process. Additionally, online optimized read (e.g., using at least one ML algorithm) can further improve read accuracy.

Figure 4:
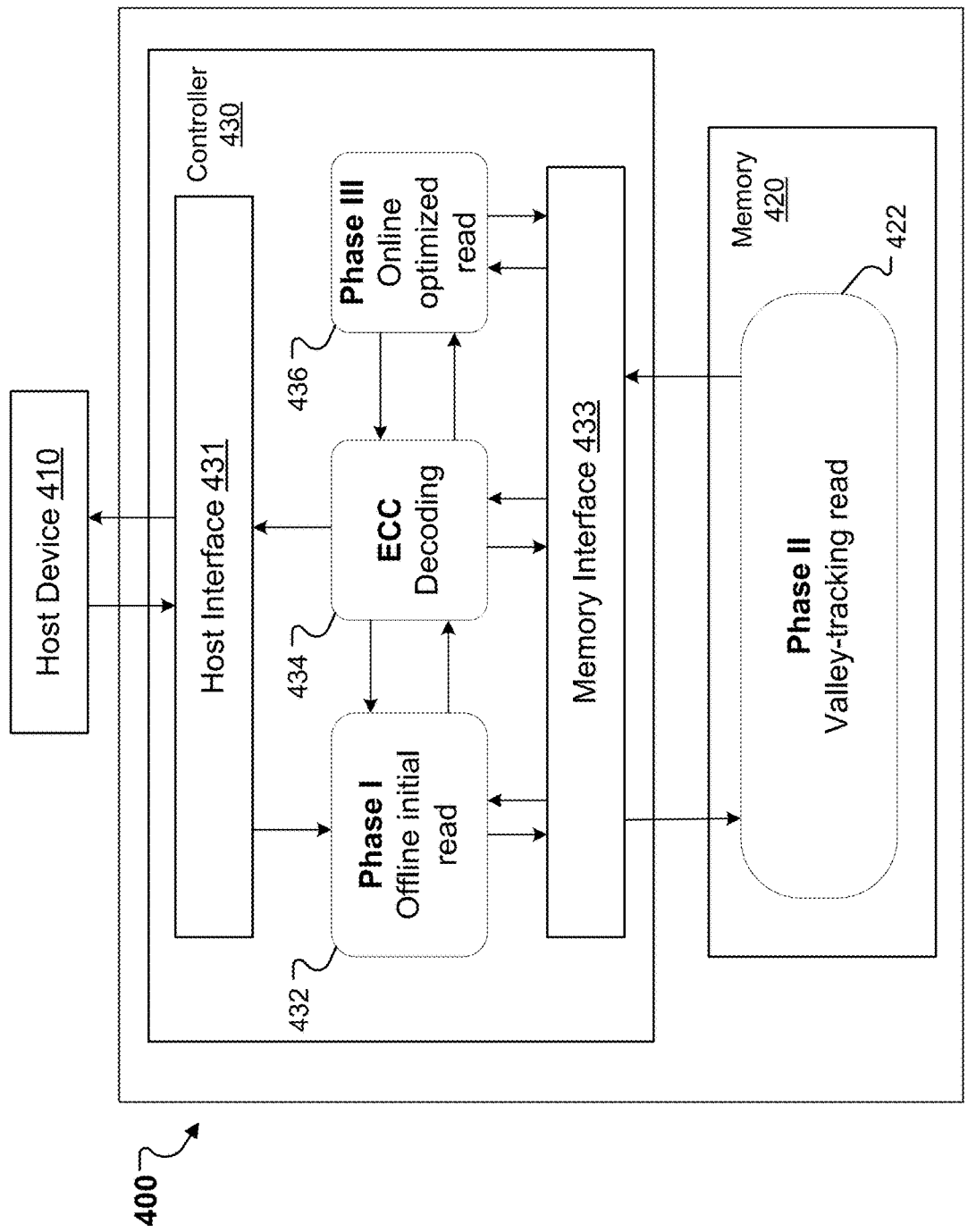
FIG. 4 illustrates an example of a memory system for determining read voltages in multiple phases, according to one or more implementations of the present disclosure.

FIG. 4 illustrates an example of a memory system 400 for determining read voltages with multiple phases, according to one or more implementations of the present disclosure. The memory system 400 can be the device 110 of FIG. 1A. The memory system 400 can be in communication with a host device 410, e.g., the host device 120 of FIG. 1A.

The memory system 400 includes a memory 420, e.g., the memory 116 of FIG. 1A, and a memory controller 430, e.g., the device controller 112 of FIG. 1A. The memory 420 can be a non-volatile memory (NVM) device and can include a plurality of NVM chips. The memory controller 430 can include a memory interface 433 configured to communicate with the memory 420. The memory interface 433 can be an open NAND flash interface (ONFI) or a toggle interface. The memory controller 430 can also include a host interface 431 configured to communicate with the host device 410.

In some implementations, the memory controller 430 includes an ECC decoder, e.g., the ECC decoder 164 of FIG. 1A. The ECC decoder can be configured to perform ECC decoding 434 (e.g., by BCH decoding or LDPC decoding) to decode memory data read from the memory 420 to detect and correct, up to an error correction capability of an ECC scheme, any bit errors that may be present in the memory data. The memory controller 430 can be configured to determine read voltages (e.g., optimal read voltages) for reading the memory data from the memory 420 in response to receiving a read request, e.g., from the host device 410 through the host interface 431. The read request can include information associated with memory data to be read from the memory 420, e.g., block address, word line address, and/or page address.

In some implementations, in response to the read request from the host device 410, the memory controller 430 can determine a first read voltage V1 by using initial offline read voltage determination (Phase I) 432. In phase I, the memory controller can determine the first read voltage using stored read voltage data based on a first set of input parameters associated with the memory data. The first set of input parameters can include block address, word line address, page address, a number of P/E cycles, a read temperature, a retention time, a read disturbance level, and/or any other suitable parameter. The read temperature represents a temperature of the memory when the memory data is read. The retention time represents a time period a memory cell in the memory data can be stored without distortion. The read disturbance level represents a level of read disturbance on the memory data.

In some cases, the first read voltage can be determined by lookup tables, functions, or hashes that can be implemented by a software component including program instructions. In some cases, the memory controller 310 includes an engine, a module, or a circuit, e.g., the offline read circuit 170 of FIG. 1A, to perform Phase I 432. The first read voltage can be inferred by a machine learning (ML) circuit using at least one ML algorithm, e.g., an offline inference ML read algorithm with supervised ML training. For example, a transfer function can be created by the supervised ML offline training and inference. The transfer function can include a lookup table having a size smaller than a normal lookup table, e.g., by grouping-based offline training. The transfer function can also include a hash function, k mean, or any other suitable form. To reduce a memory overhead, the memory controller can use a few parameters in Phase I 432 to provide a reasonable initial read that is better than a default read.

The memory controller 430 can use the first read voltage determined in Phase I 432 to read the memory data from the memory 420 to obtain a first reading output, and then the ECC decoder can decode the first reading output (e.g., by hard LDPC decoding) to detect failed bits present in the memory data using the ECC decoding 434. The memory controller 430 can determine whether the first reading output passes an ECC test by determining whether the failed bits can be corrected by the ECC decoder in a checking step. If the failed bits can be corrected, the memory controller 430 determines that the first reading output of the memory data passes the ECC test and can be output as a target reading output of the memory data, e.g., to the host device 410.

If the failed bits fail to be corrected, the memory controller 430 can determine that the first reading output fails the ECC test. In some cases, the memory controller 430 can determine at least one part of the first reading output fails the ECC test and a remainder (or a remaining part) of the first reading output passes the ECC test. For example, the memory data includes a page having four chunks. A reading output of first and second chunks fails to pass the ECC test, while a reading output of third and fourth chunks passes the ECC test. The memory controller 430 can record information of the first and second chunks and provide the information to the memory 420 for further reading in Phase II 422 by the memory 420, while the reading out of the third and fourth chunks can be considered as target reading output of the third and fourth chunks, without further reading.

Phase II 422 adopts an on-chip valley-tracking read scheme. In some implementations, the memory 420 includes an on-chip valley-tracking circuit, e.g., the circuit 190 of FIG. 1A, configured to determine read voltages using the on-chip valley-tracking scheme based on a second set of parameters. The second set of parameters can include information from the memory controller 430. For example, the memory controller 430 can provide the first read voltage V1 and a valley-tracking voltage range ΔV to the memory 420. The memory 420 can determine a second read voltage V2 using the on-chip valley-tracking scheme based on the first read voltage V1 and the valley-tracking voltage range ΔV. The first read voltage V1 and the valley-tracking voltage range ΔV can determine a search voltage range [V1−ΔV/2, V1+ΔV/2]. The valley-tracking voltage range ΔV can be determined by the memory controller 430 based on the first read voltage V1 and a number of parameters, e.g., the first set of input parameters. The number of parameters can include block address, word line address, page address, a number of P/E cycles, a read temperature, a retention time, a read disturbance level, and/or any other suitable parameter.

FIG. 5A illustrates example valley-tracking ranges for TLC memory cells. As illustrated in FIG. 2B, the TLC memory cells have eight states and can be read out by seven read voltages, RD[0] to RD[6] (or RD[0:6]). Each read voltage and associated valley-tracking range can be individually determined based on a number of parameters. For example, FIG. 5A shows information of the TLC memory cells, including word line index (e.g., 2, 3), page index (e.g., 0, 1, 2, 3), P/E cycle (e.g., 3K), and retention time (e.g., 2 years). A default valley-tracking range corresponding to each read voltage of RD[0:6] is 8 units, where a unit is 0.0125 V.

An optimal read voltage can be affected by the number of parameters. Different memory cells having different parameters can have different changes in optimal read voltages. For example, memory cells with a lower state can be degraded worse than memory cells with a higher state, thus, a valley-tracking range for the lower state can be set to be larger than a valley-tracking range for the higher state.

In some implementations, a memory controller, e.g., the memory controller 430 of FIG. 4, determines the valley-tracking ranges for the memory cells based on a result of a previous read by the memory controller, e.g., the offline initial read Phase I 432 of FIG. 4. In some implementations, the valley-tracking ranges can be also determined by the memory 420 based on the result of the previous read by the memory controller.

In the offline initial read, a first read voltage can be determined based on stored read voltage data using a first set of parameters associated with target memory data. The stored read voltage data can be generated based on supervised ML training using a plurality of inputs associated with the memory and corresponding optimal read voltages. The valley-tracking range for the first read voltage can be determined based on the first read voltage and the corresponding optimal read voltages used to determine the first read voltage.

In some examples, the valley-tracking range can be determined based on an expression as below:

$$\text{Range}_{VT} = \alpha \cdot |RD_{ML} - \text{AVG}(RD_{Optimal\ for\ training})|,$$

where $\text{Range}_{VT}$ represents the valley-tracking range, $RD_{ML}$ represents the first read voltage obtained by machine learning, $RD_{Optimal\ for\ training}$ represent the corresponding optimal read voltages for training inputs in the machine learning, and α represents a scaling factor, e.g., 2.

In some examples, the valley-tracking range is set to have an upper bound (or upper threshold), e.g., 30, to avoid out of a reasonable range, and a lower bound (or lower threshold), e.g., 2, to make sure that the valley-tracking read determination (Phase II) can be triggered.

FIG. 5B illustrates example valley-tracking ranges for the same TLC memory cells as those in FIG. 5A but with input from the memory controller. Different from the default valley tracking ranges that are the same for the TLC memory cells at different states as shown in FIG. 5A, the valley tracking ranges determined by the memory controller based on the result of Phase I vary according to the number of parameters, including the word line index, the page index, and the states. For example, it is shown that the valley tracking ranges are larger for memory cells with larger threshold voltage changes and smaller for memory cells with smaller threshold voltage changes. In this way, the valley-tracking read scheme in Phase II can improve the read accuracy, speed, and reliability.

With further reference to FIG. 4, in Phase II, bits stored in the memory 420 are read out and counted at a succession of different read voltages in the determined search voltage range, and a curve showing a change in bit count resulting from each change in read voltage is observed. The voltage with a minimum change in bit count can correspond to a bottom of a valley of the curve, and can provide an optimal read voltage as the second read voltage V2. As noted above, the valley-tracking read scheme can be also based on counting the number of cells via voltage or current.

After the second read voltage V2 is determined, the memory 420 can generate a second reading output of memory data (e.g., the failed part of the memory data in Phase I) using the second read voltage. In some cases, the memory 420 includes an ECC circuit configured to perform an ECC decoding. In some cases, the memory 420 transmits the second reading output through the memory interface 433 to the memory controller 430, and the memory controller 430 decodes the second reading output using the ECC decoding 434.

If the second reading output passes the ECC test, the memory controller 430 or the memory 420 can output the second reading output as target reading output of the memory data. The memory 420 or the memory controller 430 can use a result of the valley-tracking read (Phase II) 422, e.g., the second read voltage V2 and associated parameters, to update stored read voltage data that is used to determine initial read voltages in Phase I 432.

If the second reading output fails to pass the ECC test, the memory 420 or the memory controller 430 provides a result of the ECC test to an online optimized read circuit, e.g., the online read circuit 180 of FIG. 1A, for online optimized read (Phase III) 436. The online optimized read circuit can be integrated in the memory controller 430 or in an external microcontroller. The online read circuit can be triggered to generate a third read voltage based on a third set of parameters. The third set of parameters can include the result of the previous ECC test(s), the first set of parameters in Phase I, and the second set of parameters in Phase II. In some examples, the third set of input parameters includes a fail bit count in the second reading output of the memory data, a syndrome of LDPC code, a number of iteration of LDPC code, a number of "1" bit values on each of previous read voltages using for the memory data, previous ECC decoding results, or any other suitable parameters.

The online optimized read circuit can be an ML circuit configured to use one or more ML algorithms to determine a third read voltage based on the third set of parameters. The ML algorithms can include linear regression, support vector regression, CNN, RNN, or other suitable algorithms. The memory controller 430 can use the third read voltage to read the memory data (e.g., the failed part of the memory data) from the memory 420 to obtain a third reading output of the memory data. Then the memory controller 430 can determine whether the third reading output passes the ECC test by using the ECC decoding 434 to decode the third reading output. If the third reading output passes the ECC test, the memory controller can determine the third reading output to be the target reading output of the memory data and output the target reading output of the memory data (e.g., together with other target reading outs obtained in Phase I) to the host device 410. The memory controller can use the third read voltage and the third set of parameters to calibrate and update the stored read voltage data used in Phase I 432.

If the third reading output fails to pass the ECC test, the memory controller 430 can modify the third set of parameters based on the result of the ECC test and determine a new read voltage based on the modified third set of parameters for read. In some cases, a number of read operations is beyond a predetermined threshold (e.g., a predetermined time period or a predetermined number of reads), the memory controller 430 can determine a failure of reading the memory data. In some cases, the memory controller 430 can provide information of Phase III to the memory 420 for performing another valley-tracking read.

In some implementations, if the first reading output fails the ECC test in Phase I, the memory controller determines that the memory is busy and cannot perform Phase II, and the memory controller can directly trigger the online optimized read circuit to perform Phase III, which can improve a read efficiency.

Figure 6:
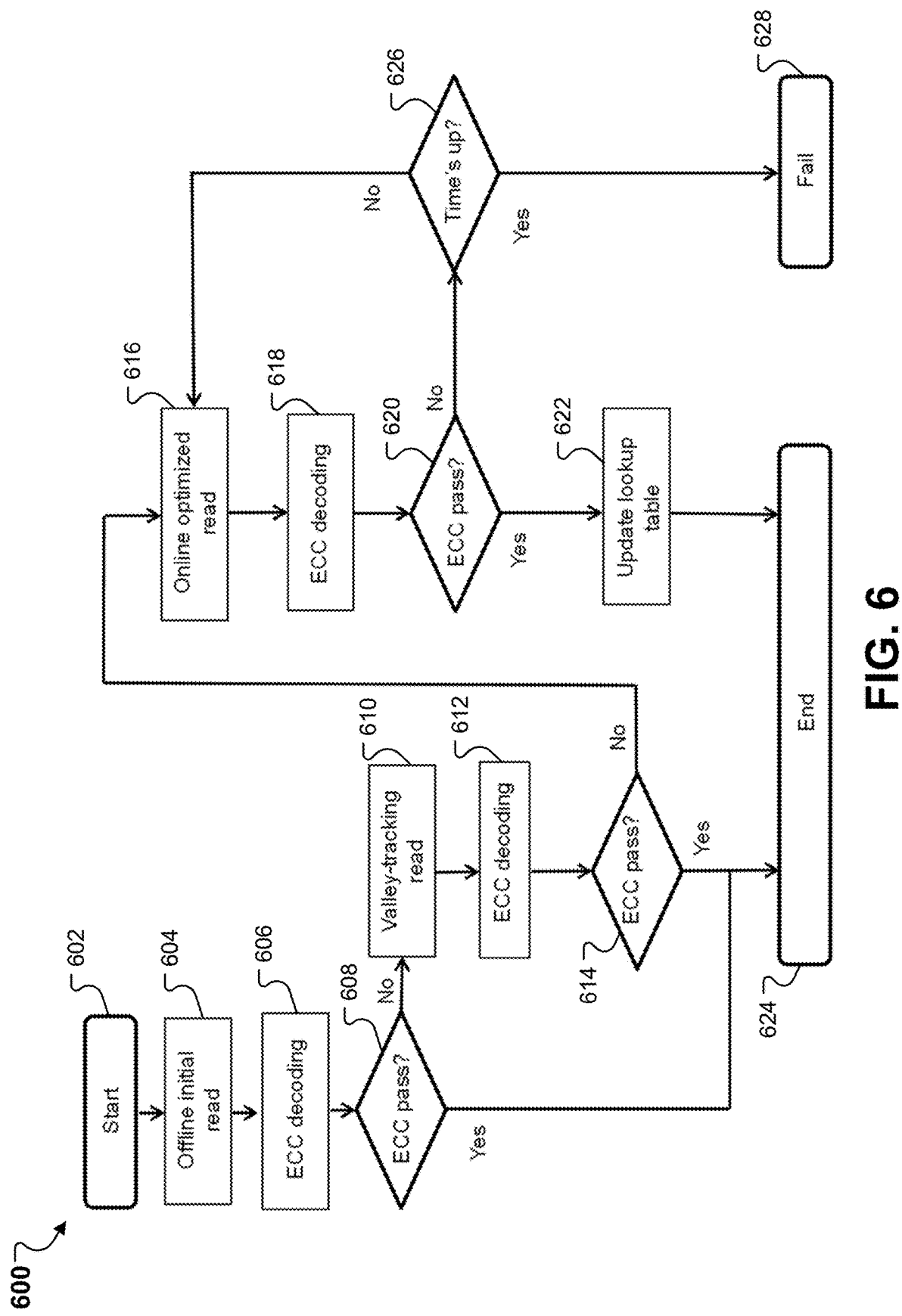
FIG. 6 illustrates an example process of determining read voltages for memory systems, according to one or more implementations of the present disclosure.

FIG. 6 illustrates an example process 600 of determining read voltages for memory systems, according to one or more implementations. The memory system can be the device 110 of FIG. 1A or the memory system 400 of FIG. 4. The memory system can include a memory, e.g., the memory 116 of FIG. 1A or 420 of FIG. 4, and a memory controller, e.g., the device controller 112 of FIG. 1A or the memory controller 430 of FIG. 4.

The memory system includes an ECC decoder, e.g., the decoder 164 of FIG. 1A, configured to perform ECC decoding (e.g., the ECC decoding 434 of FIG. 4). In some cases, the ECC decoder is included in the memory controller, e.g., as illustrated in FIGS. 1A and 4. In some cases, the ECC decoder is included in the memory. In some cases, the ECC decoder is partially in the memory controller and partially in the memory. In some cases, the memory controller includes a controller-side ECC decoder and the memory includes a memory-side ECC decoder.

The memory controller can include an offline read circuit, e.g., the circuit 170 of FIG. 1A, configured to perform an initial offline read (e.g., Phase I 432 of FIG. 4). The memory controller can also include an online read circuit, e.g., the circuit 180 of FIG. 1A, configured to perform an optimized online read (e.g., Phase III 436 of FIG. 4). The offline read circuit and the online read circuit can be implemented in an integrated circuit or a single circuit, e.g., an ML circuit. The memory can include a valley-tracking circuit, e.g., the circuit 190 of FIG. 1A, configured to perform valley-tracking read (e.g., Phase II 422 of FIG. 4).

At step 602, the process 600 starts. The process 600 can start in response to receiving a read request, e.g., from a host device such as the host device 120 of FIG. 1A or the host device 410 of FIG. 4. The read request can indicate to read target memory data from the memory. The memory data can be stored in a specified address, e.g., a specified page in a specified block, in the memory.

At step 604, a first read voltage is determined in an offline initial read phase (e.g., Phase I 432 of FIG. 4) by the memory controller, e.g., by the offline read circuit, and a first reading output is obtained by the memory controller using the first read voltage to read the target memory data from the memory. The memory can read the target memory data using the first read voltage to obtain the first reading output and transmit the first reading output to the memory controller.

The memory controller can collect a first set of parameters associated with the target memory data to be read from the memory. The first set of parameters can include at least one of address information such as block address, page address, or word line address, a number of P/E cycles (or P/E cycle count), a reading temperature, a read disturbance level, or a retention time. The memory controller can determine the first read voltage using stored read voltage data based on the first set of parameters.

The stored read voltage data can be stored in the memory controller or the memory. The stored read voltage data can be generated based on supervised ML training using a plurality of inputs associated with the memory and corresponding optimal read voltages. Each of the optimal read voltages corresponds to a minimum failed bit count of a reading output for a respective page in the memory with a respective input of the inputs. Each of the inputs can include respective values of a plurality of parameters. The plurality of parameters can include the first set of parameters. Each of the plurality of parameters can have a respective influence level on a memory cell characteristic of the memory, and value intervals of the plurality of parameters in the inputs can be determined based on the respective influence levels of the plurality of parameters. The supervised ML training can be performed offline during manufacturing the memory system and after the memory is fabricated. In some examples, the stored read voltage data includes a transfer function generated based on the supervised ML training, and the transfer function represents a relationship between an input of the plurality of parameters and an optimal read voltage. The transfer function can include a lookup table, a hash function, or a k mean.

At step 606, the ECC decoder the first reading output of the target memory data. In some cases, the ECC decoder can use a hard decision decoding scheme, e.g., hard LDPC decoding. In some cases, the ECC decoder can first use the hard decision decoding scheme. If it fails, the ECC decoder can use a soft decision decoding scheme, e.g., soft LDPC decoding. At step 608, the memory controller determines whether the first reading output passes a first ECC test, e.g., by determining whether failed error bits in the first reading output can be corrected by an ECC scheme.

If the first reading output passes the first ECC test, the process 600 ends at step 624. The memory controller can determine the first reading output as a target reading output of the target memory data and transmit the target reading output to the host device. If memory cells are MLC, TLC, or PLC, multiple read voltages can be separately determined to read the target memory data using the process 600, e.g., sequentially or in parallel.

If the first reading output fails to pass the first ECC test, the memory is triggered to perform a valley-tracking read scheme at step 610. The memory controller transmits the first read voltage determined in step 604 to the memory. The memory determines a second read voltage based on the first read voltage, and generates a second reading output associated with the target memory data using the second read voltage.

In some embodiments, the second read voltage is determined based on a second set of parameters associated with the first set of parameters. The second set of parameters can include the first read voltage and an associated valley-tracking range. In some cases, the valley-tracking range can be determined, e.g., by the memory controller, based on the first read voltage and the corresponding optimal read voltages used for machine learning training to determine the first read voltage. The valley-tracking range can be configured to be no greater than a predetermined upper threshold and no smaller than predetermined lower threshold.

In the valley-tracking read performed by the memory at step 610, the memory determines the second read voltage using a valley-tracking read scheme based on the valley-tracking range and the first read voltage. The memory can first obtain a series of values associated with reading outputs of the target memory data using a series of sequential read voltages in a range defined by the first read voltage and the valley-tracking range, and determine a read voltage corresponding to a minimum of the series of values to be the second read voltage. The series of values can include at least one of: a series of cell counts corresponding to the target memory data, a series of accumulated voltages or currents of read-out bits corresponding to the target memory data, or a series of differential voltages or currents of the accumulated voltages or currents.

In some implementations, at step 608, the memory controller determines that the first reading output fails to pass the first ECC test by determining that at least one part of the first reading output fails to pass the first ECC test. The at least one part of the first reading output corresponds to at least one failed part of the target memory data. The memory controller can record information of the at least one failed part of the target memory data and provide the information to the memory. At step 610, the memory can just read the at least one failed part of the target memory data using the second read voltage to generate the second reading output.

The memory controller can also determine that a remainder of the first reading output passes the first ECC test. The remainder of the first reading output corresponds to a remainder of the target memory data. The memory controller can determine that the remainder of the first reading output is a target reading output of the remainder of the target memory data. The memory can be configured not to read the remainder of the target memory data using the second read voltage. For example, if the target memory data includes a page having multiple chunks and a corresponding first reading out of at least one chunk of the page using the first read voltage fails to pass the first ECC test, the memory can just read the at least one chunk using the second read voltage, without reading other chunks of the page that pass the first ECC test.

At step 612, the second reading output is decoded by an ECC decoding. In some cases, the ECC decoder can first use a hard decision decoding scheme, e.g., hard LDPC decoding. If it fails, the ECC decoder can then use a soft decision decoding scheme, e.g., soft LDPC decoding. In some cases, the memory provides the second reading output to the memory controller, and the memory controller decodes the second reading output and determines whether the second reading output passes a second ECC test at step 614. In some cases, the memory includes an ECC circuit that decodes the second reading output and determines whether the second reading output passes the second ECC test at step 614.

If the second reading output passes the second ECC test, the process 600 proceeds to step 624. The memory controller outputs the second reading output as a target reading output for the target memory data. If the second reading output is just for failed part in the target memory data, the memory controller can combine the first reading output for the remainder of the target memory data and the second reading output to obtain the target reading output of the target memory data. The memory controller can also update the stored read voltage data with the second read voltage that is used to determine the first read voltage at step 604.

If the second reading output fails to pass the second ECC test, an online optimized read is triggered at step 616. The memory controller determines a third read voltage based on a third set of parameters. The third set of parameters include at least one of a result of the second ECC test or the first set of parameters and/or the second set of parameters. The memory controller can obtain a third reading output associated with the target memory data in the memory using the third read voltage. If only part of the target memory data fails to pass the first ECC test and/or the second ECC test, the online optimized read can be only performed on the part of the target memory data using the third read voltage.

The memory controller can determine the third read voltage by using at least one machine learning (ML) algorithm based on the second set of parameters. The at least one ML algorithm can include at least one of a linear regression, a support vector regression, or a deep learning algorithm including a convolutional neural network (CNN) algorithm or a Recurrent Neural Network (RNN) algorithm. The third set of parameters can include at least one of a failed bit count in the second reading output, a number of "1" values obtained for each read voltage, a number change of "1" values between a previous read voltage and a current read voltage, a read time, a syndrome of low-density parity-check (LDPC) code, or a number of iteration of LDPC code.

At step 618, the third reading output is decoded by ECC decoding. In some cases, the third reading output is decoded by a hard decision decoding scheme. In some cases, the third reading output is decoded by a soft decision decoding scheme. In some cases, the third reading output is first decoded by the hard decision decoding scheme. If the third reading output fails to pass an ECC test, the third reading output can be then decoded by the soft decision decoding scheme.

At step 620, the memory controller determines whether the third reading output passes a third ECC test. In response to determining that the third reading output passes the third ECC test, the memory controllers updates the stored read voltage data using at least one of the third read voltage or the third set of parameters at step 622. The memory controller can also output the third reading output as a target reading output for the target memory data. In some cases, the memory controller outputs the third reading output and a remainder of the first reading output and/or a remainder of the second reading output as a target reading output of the target memory data. The remainder of the first reading output passes the first ECC test, and the remainder of the second reading output passes the second ECC test.

If the third reading output fails to pass the third ECC test, the memory controller determines whether a predetermined read threshold has been reached at step 626. The predetermined read threshold can be a predetermined time period or a predetermined number of reads. For example, the predetermined number of reads can be 5 or 10. If the predetermined read threshold has been reached, the memory controller determines a failure of reading the target memory data from the memory at step 628. If the predetermined read threshold has not been reached, the process 600 returns to step 616. The memory controller can determine a new read voltage based on a result of the third ECC test.

In some implementations, the memory controller is configured to obtain a first particular reading output of particular memory data to be read from the memory using a first particular read voltage that is determined based on a first particular set of parameters associated with the particular memory data. If the memory controller determines that the first particular reading output fails to pass a corresponding ECC test and that the memory is busy, the memory controller can directly trigger the online optimized read at step 616. That is, the memory controller can determine a second particular read voltage based on a second particular set of parameters including a least one of a result of the corresponding ECC test associated with the first particular reading output or the first particular set of parameters. The memory controller can obtain a second particular reading output by reading the particular memory data using the second particular read voltage, and determine whether the second particular reading output passes the corresponding ECC test. If the memory controller determines that the second particular reading output passes the corresponding ECC test, the memory controller can output the second particular reading output as a target reading output of the particular memory data in the memory.

In some implementations, the memory system can first use valley-tracking read scheme to address retention time and chip-by-chip variation issues and then use online optimized read scheme to improve detection accuracy. The memory can be configured to: determine a first read voltage based on a first set of parameters associated with memory data using a valley-tracking read scheme, and generate a first reading output of the memory data using the first read voltage. The memory controller can be configured to: in response to determining that the first reading output fails to pass a first Error-Correcting Code (ECC) test, determine a second read voltage based on a second set of parameters that includes at least one of a result of the first ECC test and the first set of parameters, obtain a second reading output of the memory data in the memory using the second read voltage, determine whether the second reading output passes a second ECC test, and in response to determining that the second reading output passes the second ECC test, output the second reading output as a target reading output for the memory data.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system comprising:
a memory storing data; and
a memory controller coupled to the memory,
wherein the memory controller and the memory are configured to determine at least one accurate read voltage for reading target memory data stored in the memory with multiple sequential phases comprising a first phase, a second phase, and a third phase,
wherein, in the first phase, the memory controller is configured to: determine a first read voltage for reading the target memory data stored in the memory, obtain a first reading output of the target memory data stored in the memory using the first read voltage, and in response to determining that the first reading output fails to pass a first Error-Correcting Code (ECC) test, provide the first read voltage to the memory,
wherein, in the second phase, the memory is configured to: determine a second read voltage for reading the target memory data stored in the memory based on the first read voltage, the second read voltage being different from the first read voltage, and generate a second reading output associated with the target memory data using the second read voltage, and
wherein, in the third phase, the memory controller is configured to:
determine whether the second reading output passes a second ECC test,
in response to determining that the second reading output fails to pass the second ECC test, determine, by an online optimized read circuit for online optimized read, a third read voltage for reading the target memory data stored in the memory, the third read voltage being different from the second read voltage, and
generate a third reading output associated with the target memory data using the third read voltage.

2. The memory system of claim 1, wherein the memory controller is configured to:
determine that the second reading output passes a second ECC test; and
output the second reading output as a target reading output for the target memory data.

3. The memory system of claim 1, wherein the first read voltage is determined based on stored read voltage data using a first set of parameters associated with the target memory data.

4. The memory system of claim 3, wherein the memory controller is configured to:
determine the third read voltage based on a second set of parameters, the second set of parameters comprising at least one of a result of the second ECC test or the first set of parameters;
determine whether the third reading output passes a third ECC test.

5. The memory system of claim 4, wherein the memory controller is configured to:
in response to determining that the third reading output fails to pass the third ECC test, determine whether a predetermined read threshold has been reached;
in response to determining that the predetermined read threshold has been reached, determine a failure of reading the target memory data from the memory; and
in response to determining that the predetermined read threshold has not been reached, determine a new read voltage based on a result of the third ECC test.

6. The memory system of claim 4, wherein the memory controller is configured to:
in response to determining that the third reading output passes the third ECC test, output the third reading output as a target reading output for the target memory data.

7. The memory system of claim 6, wherein the memory controller is configured to determine the first read voltage using stored read voltage data based on the first set of parameters, and
wherein the memory controller is configured to: in response to determining that the third reading output passes the third ECC test, update the stored read voltage data using at least one of the third read voltage or the second set of parameters.

8. The memory system of claim 4, wherein the memory controller is configured to determine the third read voltage by using at least one machine learning (ML) algorithm based on the second set of parameters.

9. The memory system of claim 4, wherein the memory controller is configured to:
  decode the first reading output using a hard decision decoding scheme; and
  decode the third reading output using at least one of the hard decision decoding scheme or a soft decision decoding scheme.

10. The memory system of claim 4, wherein the second set of parameters comprises at least one of a failed bit count in the second reading output, a number of "1" values obtained for each read voltage, a number change of "1" values between a previous read voltage and a current read voltage, a read time, a syndrome of low-density parity-check (LDPC) code, or a number of iteration of LDPC code.

11. The memory system of claim 3, wherein the first set of parameters comprises at least one of address information, a number of P/E cycles, a reading temperature, a read disturbance level, or a retention time.

12. The memory system of claim 3, wherein the stored read voltage data is generated based on supervised ML training using a plurality of inputs associated with the memory and corresponding optimal read voltages, each of the optimal read voltages corresponding to a minimum failed bit count of a reading output for a respective page in the memory with a respective input of the inputs, each of the inputs comprising respective values of a plurality of parameters, the plurality of parameters comprising the first set of parameters.

13. The memory system of claim 12, wherein the memory controller is configured to determine a valley-tracking range based on the first read voltage and the corresponding optimal read voltages for the plurality of inputs, and
  wherein the memory is configured to determine the second read voltage using a valley-tracking read scheme based on the valley-tracking range and the first read voltage.

14. The memory system of claim 1, wherein the memory controller is configured to:
  determine that the first reading output fails to pass the first ECC test by determining that at least one part of the first reading output fails to pass the first ECC test, the at least one part of the first reading output corresponding to at least one failed part of the target memory data, and
  wherein the memory is configured to read the at least one failed part of the target memory data using the second read voltage to generate the second reading output.

15. The memory system of claim 14, wherein the memory controller is configured to:
  determine that a remainder of the first reading output passes the first ECC test, wherein the remainder of the first reading output corresponds to a remainder of the target memory data and passes the first ECC test; and
  determine that the remainder of the first reading output is a target reading output of the remainder of the target memory data,
  wherein the memory is configured not to read the remainder of the target memory data using the second read voltage.

16. The memory system of claim 1, wherein the memory controller is configured to:
  obtain a first particular reading output of particular memory data to be read from the memory using a first particular read voltage that is determined based on a first particular set of parameters associated with the particular memory data;
  determine that the first particular reading output fails to pass a corresponding ECC test;
  in response to determining that the memory is busy, determine a second particular read voltage based on a second particular set of parameters including at least one of a result of the corresponding ECC test associated with the first particular reading output or the first particular set of parameters;
  obtain a second particular reading output by reading the particular memory data using the second particular read voltage;
  determine whether the second particular reading output passes the corresponding ECC test; and
  in response to determining that the second particular reading output passes the corresponding ECC test, output the second particular reading output as a target reading output of the particular memory data in the memory.

17. A memory system comprising:
  a memory comprising a memory-side read circuit; and
  a memory controller comprising a controller-side read circuit,
  wherein the memory controller and the memory are configured to determine at least one accurate read voltage for reading target memory data stored in the memory with multiple sequential phases comprising a first phase, a second phase, and a third phase,
  wherein, in the first phase, the memory controller is configured to:
    determine, by the controller-side read circuit, a first read voltage using stored read voltage data based on a first set of parameters associated with the target memory data to be read from the memory;
    obtain a first reading output of the target memory data using the first read voltage; and
    in response to determining that at least one part of the first reading output fails to pass a first Error-Correcting Code (ECC) test, provide the first read voltage and information of at least one failed part of the target memory data corresponding to the at least one part of the first reading output to the memory,
  wherein, in the second phase, the memory is configured to:
    determine, by the memory-side read circuit, a second read voltage for reading the at least one failed part of the target memory data based on the first read voltage, the second read voltage being different from the first read voltage; and
    generate a second reading output of the at least one failed part of the target memory data using the second read voltage, and
  wherein the controller-side read circuit comprises an online optimized read circuit for online optimized read, and wherein, in the third phase, the memory controller is configured to:
    determine that the second reading output fails to pass a second ECC test;
    determine, by the online optimized read circuit, a third read voltage based on a second set of parameters including at least one of a result of the second ECC test or the first set of parameters; and generate a third reading output of the at least one failed part of the target memory data using the third read voltage.

18. The memory system of claim 17, wherein the memory controller is configured to:

determine whether the third reading output passes a third ECC test;

in response to determining that the third reading output passes the third ECC test, output the third reading output and a remainder of the first reading output as a target reading output of the target memory data, wherein the remainder of the first reading output passes the first ECC test; and update the stored read voltage data with at least one of the third read voltage or the second set of parameters.

19. The memory system of claim 18, wherein the memory-side read circuit is configured to determine the second read voltage using a valley-tracking read scheme based on a valley-tracking range determined by the memory controller, and wherein the controller-side read circuit is configured to determine the third read voltage using at least one machine learning algorithm based on the second set of parameters.

20. A memory system comprising:

a memory storing data; and a memory controller coupled to the memory, wherein the memory and the memory controller are configured to determine at least one accurate read voltage for reading memory data stored in the memory with multiple sequential phases comprising a first phase and a second phase sequential to the first phase, wherein, in the first phase, the memory is configured to:

determine a first read voltage for reading the memory data stored in the memory based on a first set of parameters associated with the memory data using a valley-tracking read scheme, and generate a first reading output of the memory data using the first read voltage, wherein, in the second phase, the memory controller is configured to:

in response to determining that the first reading output fails to pass a first Error-Correcting Code (ECC) test, determine, by an online optimized read circuit for online optimized read, a second read voltage for reading the memory data stored in the memory based on a second set of parameters that comprises at least one of a result of the first ECC test and the first set of parameters;

obtain a second reading output of the memory data in the memory using the second read voltage;

determine whether the second reading output passes a second ECC test; and in response to determining that the second reading output passes the second ECC test, output the second reading output as a target reading output for the memory data.

* * * * *